(12) United States Patent
Friend et al.

(10) Patent No.: US 6,384,528 B1
(45) Date of Patent: May 7, 2002

(54) ELECTROLUMINESCENT DEVICE

(75) Inventors: Richard Henry Friend, Cambridge (GB); Karl Pichler, Hopewell Junction, NY (US); David John Lacey, Ashwell (GB)

(73) Assignee: Cambridge Display Technology Limited (GB)

(*) Notice: Subject to any disclaimer, the term of this patent is extended or adjusted under 35 U.S.C. 154(b) by 0 days.

(21) Appl. No.: 09/196,983

(22) Filed: Nov. 20, 1998

(30) Foreign Application Priority Data

Nov. 21, 1997 (GB) .............................. 9724682

(51) Int. Cl.[7] .......................................... H05B 33/00
(52) U.S. Cl. ..................................... 313/504; 428/690
(58) Field of Search ............................... 313/504, 502, 313/505, 506, 509, 507, 498; 428/690; 427/66

(56) References Cited

U.S. PATENT DOCUMENTS

| | | | |
|---|---|---|---|
| 5,104,683 A | 4/1992 | Robertson ..................... | 427/38 |
| 5,667,607 A | 9/1997 | Sugiura et al. ................ | 156/67 |
| 5,670,207 A | 9/1997 | Nire et al. ................ | 427/126.2 |
| 5,693,428 A | * 12/1997 | Fujii et al. ................... | 428/690 |
| 5,773,130 A | * 6/1998 | So et al. ....................... | 428/195 |
| 5,792,561 A | * 8/1998 | Whang et al. ............... | 428/457 |

FOREIGN PATENT DOCUMENTS

| | | |
|---|---|---|
| EP | 0390551 A2 | 10/1990 |
| EP | 0550063 A2 | 7/1993 |
| EP | 0553950 A2 | 8/1993 |
| EP | 0653149 B1 | 5/1995 |
| EP | 0686662 A | 12/1995 |
| GB | 2313478 A | 11/1997 |
| JP | 08213172 | 8/1996 |
| WO | WO 90/13148 | 11/1990 |
| WO | WO 95/06400 | 3/1995 |
| WO | WO 98/04610 | 2/1998 |

OTHER PUBLICATIONS

J. Kido et al., "Single–Layer White Light–Emitting Organic Electroluminescent Devices Based On Dye–Dispersed Poly(N–Vinylcarbazole)," Appl. Phys. Lett. 67 (16), Oct. 16, 1995, pp. 2281–2283.

Hosokawa et al., "Performance of RGB Multi–Color Organic El Display," IS&T's 49th Annual Conference, pp. 388–391.

Fahlman et al., "Poly(2,5–diheptyl–1,4–phenylene–alt–2, 5–thienylene): A New Material For Blue–Light–Emitting Diodes," Synthetic Metals, 75 (1955), pp. 223–228.

(List continued on next page.)

Primary Examiner—Nimeshkumar D. Patel
Assistant Examiner—Karabi Guharay
(74) Attorney, Agent, or Firm—Finnegan, Henderson, Farabow, Garrett & Dunner

(57) ABSTRACT

An electroluminescent device comprising: a first charge-carrier injecting layer for injecting positive charge-carriers; a second charge-carrier injecting layer for injecting negative charge-carriers; a layer of a first organic material located between the charge-carrier injecting layers; and located between the layer of a first organic material and one of the charge-carrier injecting layers: a first light-emissive region comprising a light-emissive second organic material having an energy-gap less than that of the first organic material; and a second light-emissive region comprising a first component of a light-emissive third organic material having an energy-gap greater than that of the first organic material, and a second component having at least one energy level off-set from that of the first component; such that when charge-carriers are injected in the first region by the charge-carrier injecting layers light is emitted principally from the second organic material and when charge-carriers are injected in the second region by the charge-carrier injecting layers light is emitted principally from the third organic material.

26 Claims, 1 Drawing Sheet

OTHER PUBLICATIONS

Berggren et al., "Light–Emitting Diodes With Variable Colours From Polymer Blends," Nature, vol. 372, Dec. 1, 1994, pp. 444–446.

Hamaguchi et al., "Blue Electroluminescence From Poly(2, 5–diheptyloxy–1,4–phenylene)," Jpn. J. Appl. Phys. vol. 34 (1995), pp. L587–L589, Part 2, No. 5A, May 1, 1995.

Sokolik et al, "Blue–Light Electroluminescence From P–Phenylene Vinylene–Based Copolymers," J. Appl. Phys. 74 (5), Sep. 1, 1993, pp. 3584–3586.

Hosokawa et al., "Highly Efficient Blue Electroluminescence From A Distyrylarylene Emitting Layer With A New Dopant," Appl. Phys. Lett. 67 (26), Dec. 25, 1995, pp. 3853–3855.

Salbeck, "Electroluminescence With Organic Compounds," Ber. Bunsenges, Phys. Chem. 100, pp. 1667–1677 (1996), No. 10.

Bayer AG's Provisional Product Information Sheet For Trial Product Al 4071, Sep. 1995.

Becker et al., "Effect Of Metal Films On The Photoluminescence And Electroluminescence Of Conjugated Polymers," Physical Review B, vol. 56, No. 4, Jul. 15, 1997, pp. 1893–1905.

Garten et al., "Efficient Blue LED From A Partially Conjugated Si–Containing PPV Copolymer in A Double–Layer Configuration," Adv. Materials 1997, vol. 9, No. 2, pp. 127–131.

Brown et al., "Electroluminescence From Multilayer Conjugated Polymer Devices: Spatial Control Of Exciton Formation And Emission," Chemical Physics Letters, vol. 200, No. 1,2, Nov. 27, 1992, pp. 46–54.

Kido et al., "Multilayer White Light–Emitting Organic Electroluminescent Device," Science, vol. 267, Mar. 3, 1995, pp. 1332–1334.

Nishino et al., "Electroluminescence From Blend Films Of Poly(3–Hexylthiophene) And Poly(N–Vinylcarbazole)," Synthetic Metals 68 (1995), pp. 243–247.

Parker et al., "Efficient Blue Electroluminescence From A Fluorinated Polyquinoline," Appl. Phys. Lett. 65 (10), Sep. 5, 1994, pp. 1272–1274.

Ohmori et al., "Carrier Transport In A Three–Layered Electroluminescent Device," J. Phys. D: Appl. Phys. 29 (1996), pp. 2983–2987.

Hamaguchi et al., "Voltage– And Polarity–Tunable Multicolor Organic Electroluminescent Devices," Jpn. J. Appl. Phys. vol. 35 (1996) pp. L1462–L1464, Part 2, No. 11A, Nov. 1, 1996.

Hamaguchi et al., "Color–Variable Emission In Multilayer Polymer Electroluminescent Devices Containing Electron–Blocking Layer," Jpn. J. Appl. Phys. vol. 35 (1996), pp. 4813–4818, Part 1, No. 9A, Sep. 1996.

Cacialli et al., "Efficient Green Light–Emitting Diodes From A Phenylated Derivative Of Poly(P–Phenylene–Vinylene)," Appl. Phys. Lett. 69 (25), Dec. 16, 1996, pp. 3794–3796.

Hamaguchi et al., "Color–Variable Electroluminescence From Multilayer Polymer Films," Appl. Phy. Lett. 69 (2), Jul. 8, 1996, pp. 143–145.

Uchida et al., "Color–Variable Light–Emitting Diode Utilizing Conducting Polymer Containing Fluorescent Dye," Jpn. J. Appl. Phys. vol. 32 (1993), pp. L921–L924, Part 2, No. 7A, Jul. 1, 1993.

Jordan et al., "White Organic Electroluminescence Devices," Appl. Phys Lett. 68 (9), Feb. 26, 1996, pp. 1192–1194.

J. Kalinowski et al., "Voltage–Tunable–Color Multilayer Organic Light Emitting Diode," Appl. Phys. Lett. 68 (17), Apr. 22, 1996, pp. 2317–2319.

Kido et al., "White–Light–Emitting Organic Electroluminescent Device Using Lanthanide Complexes," Jpn. J. Appl. Phys. vol. 35 (1996), pp. L394–L396, Part 2, No. 3B, Mar. 15, 1996.

Yoshida et al., "Polarity–Dependent Multicolor Organic Electroluminescent Device," Jpn. J. Appl. Phys. vol. 35 (1996), pp. L397–L400, Part 2, No. 3B, Mar. 15, 1996.

Suzuki et al., "Behavior Of Charge Carriers And Excitons In Multilayer Organic Light–Emitting Diodes Made From A Polysilane Polymer As Monitored With Electroluminescence," J. Appl. Phys. 79 (2), Jan. 15, 1996, pp. 858–865.

Van Slyke et al., "Blue Organic Light Emitting Devices," Inorganic and Organic Electroluminescence, Berlin 1996 (Wissenschaft & Technik Verlag, edited by R H Mauch & H–E Gumlich), pp. 196–200.

Xue et al., "Color–Changing Of Polymeric Light–Emitting Diode," Inorganic and Organic Electroluminescence, Berlin 1996 (Wissenschaft & Technik Verlag, edited by R H Mauch & H–E Gumlich), pp. 215–218.

* cited by examiner

ELECTROLUMINESCENT DEVICE

BACKGROUND OF THE INVENTION

This invention relates to electroluminescent devices, especially those that have a conjugated polymer as a light-emitting layer.

One type of electroluminescent device is described in PCT/WO90/13148, the contents of which are incorporated herein by reference. The basic structure of this device is a light-emitting polymer film (for instance a film of a poly(p-phenylenevinylene)—"PPV") sandwiched between two electrodes, one of which injects electrons and the other of which injects holes. It is believed that the electrons and holes excite the polymer film, emitting photons. These devices are useful as flat panel displays, in which case one of the electrodes is transparent—for example being made of indium-tin oxide ("ITO").

Numerous structures have been developed in which there are two or more organic layers between the electrodes. For example, EP 0 653 149 discloses devices having several organic light-emissive semiconductor polymer layers, each of a different band-gap. In these devices all of the light-emissive layers emit significantly when the device is in use. This makes it complex to precisely tailor the output of such a device precisely.

In other devices the organic layer between the electrodes is formed as a blend of a light-emitting organic material with another material, such as polyvinylcarbazole ("PVK"). (See, for example, J Kido et al., Appl. Phys. Left. 67 (1995) 2281). Trap states in the PVK can be used to help localise charge-carriers and excited states and thereby suppress diffusion of these states and energy transfer to lower energy sites within the PVK/emitter blend or to an adjacent layer.

Organic light emitting materials have potential for multi-colour displays, for example with each pixel of the display having red-, green- and blue-emitting sub-pixels. However, manufacturing such a display in which each sub-pixel emits light as an individual electroluminescent device has been thought to require optimisation of the charge-injecting layers for each colour. This would be very complex. Therefore, one solution has been to provide a single electroluminescent layer (e.g. a blue-emitting layer) which can initiate light emission for each sub-pixel. The sub-pixels that are required to emit light of the other colours (e.g. red and green) are provided with fluorescent layers of those colours, located outside the charge-injecting layers of the device, to convert emissions from the electroluminescent layer by absorbing and re-emitting photons. (See, for example, C Hosokawa et al., 49th Annual Conference of the Society for Imaging Science and Technology, May 1996, Minneapolis, p388). This approach reduces the overall efficiency of the device.

SUMMARY OF THE INVENTION

According to one aspect of the present invention there is provided an electroluminescent device comprising: a first charge-carrier injecting layer for injecting positive charge-carriers; a second charge-carrier injecting layer for injecting negative charge-carriers; a layer of a first organic material located between the charge-carrier injecting layers; and located between the layer of a first organic material and one of the charge-carrier injecting layers: a first light-emissive region comprising a light-emissive second organic material having an energy-gap less than that of the first organic material; and a second light-emissive region comprising a first component of a light-emissive third organic material having an energy-gap greater than that of the first organic material, and a second component having at least one energy level off-set from that of the first component; such that when charge-carriers are injected in the first region by the charge-carrier injecting layers light is emitted principally from the second organic material and when charge-carriers are injected in the second region by the charge-carrier injecting layers light is emitted principally from the third organic material.

The or each energy level may be a conduction band (lumo) energy level and/or a valence band (homo) energy level and/or an additional energy level, such as a trap state, within the band gap.

Preferably the said one of the charge-injecting layers is the first charge-injecting layer and the other of the charge-injecting layers is the second charge-injecting layer.

The first charge-carrier injecting layer is preferably formed of a transparent material. The first charge-carrier injecting layer is preferably conductive, most preferably a conductive oxide such as ITO.

The second charge-carrier injecting layer is preferably formed of a low work-function metal or alloy. The metal or alloy preferably has a work function of less than 3.5eV, most preferably less than 3eV. The layer preferably comprises calcium and/or lithium. The layer is suitably deposited by evaporation or sputtering, most preferably DC magnetron sputtering.

The first organic material is suitably a partially or fully conjugated material. It is preferably a polymer, and most preferably a semiconductive conjugated polymer such as PPV, which could be derived from a precursor route. The first organic material is preferably a light-emissive material, being capable of emitting light by means of, for example, molecules, oligomers or polymers.

The term "conjugated" indicates a polymer for which the main chain is either fully conjugated, possessing extended pi molecular orbitals along the length of the chain, or is substantially conjugated, but with interruptions to conjugation at various positions, either random or regular, along the main chain. It includes within its scope homopolymers and copolymers.

The composition of the second light-emissive region, suitably together with the thickness selected for the layer of a first organic material, preferably acts to suppress (and most preferably to suppress essentially) light emission from the layer of a first organic material. This approach suitably allows the same layer of a first organic material, and preferably also the same charge-carrier injecting layer, to overly the first and second light-emissive regions without significantly compromising the emission colouros of the first and second light-emissive regions.

The thickness of the layer of a first organic material is suitably less than 500Å and preferably less than or around 200Å.

The layer of a first organic material preferably abuts one of the charge-carrier injecting layers, suitably that for injecting negative charge-carriers.

The layer of a first organic material may also be amenable to sputter deposition, most preferably being resistant to degradation during a sputter deposition operation—for example during sputter deposition of a subsequent and/or adjacent layer. The layer of a first organic material is preferably capable of acting as a sputter protection layer for another layer of the device. For example, the layer of a first organic material may serve to protect the material of one or both of the first and second light-emissive regions from damage during sputter deposition of one of the charge-carrier injecting layers, suitably the one (if any) that abuts the layer of a first organic material.

Thus, according to the present invention from a second aspect there is provided a method for producing an electroluminescent device, comprising the steps of: depositing a first charge-carrier injecting layer for injecting positive charge-carriers; depositing a first light-emissive region comprising a light-emissive first organic material; and depositing a second light-emissive region comprising a first component of a light-emissive second organic material, and a second component having at least one energy level off-set from that of the first component; depositing a layer of a third organic material resistant to degradation during a sputter deposition process and having an energy gap greater than that of the first organic material and less than that of the second organic material; and depositing a second charge-carrier injecting layer for injecting negative charge-carriers; to provide a device such that when charge-carriers are injected in the first region by the charge-carrier injecting layers light is emitted principally from the first organic material and when charge-carriers are injected in the second region by the charge-carrier injecting layers light is emitted principally from the second organic material. Preferably the second charge-carrier injecting layer is deposited by sputter deposition. An alternative is vapour deposition.

In the second aspect of the invention the first organic material corresponds to the second organic material of the first aspect of the invention, the second organic material corresponds to the third organic material of the first aspect of the invention and the third organic material corresponds to the first organic material of the first aspect of the invention. For consistency the terminology of the first aspect of the invention will be used in this description but it should be understood that (where appropriate) the features that are described apply correspondingly to the second aspect of the invention.

In the second light-emissive region the first component and the second component are suitably mixed or blended. The components may be two emissive materials of different energy gaps. The second light emissive region may suitably comprise one of the following:

poly(2,5-diheptyl-1,4-phenylene-alt-2,5-thienylene)

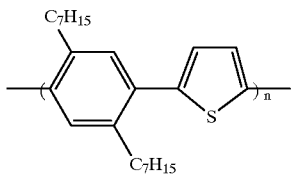

in poly(2,5diheptyl-2',5'-dipentoxy-biphenylene) (see Synthetic Metals 75 (1995) p223

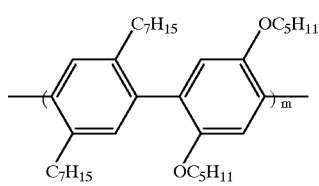

a blend of different poly-thiophenes having different energy gaps, including, for example, poly(3-cyclohexyl-4methyl-thiophene) (see Nature 372 (1994) p444)

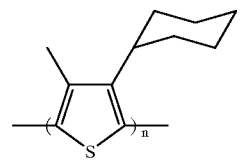

a blend of soluble polyphenylene derivatives having different energy gaps, such as alkyl- and alkoxy-polyphenylenes;

a blend of two or more of the following materials: polyvinylcarbazole ("PVK") (or an equivalent material)

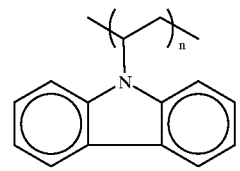

polyfluorene

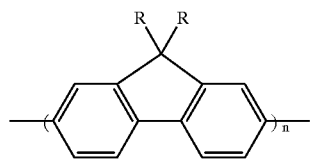

poly(2-alkoxy-p-phenylene)

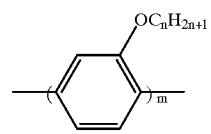

poly(2,5diheptoxy-1,4-phenylene) (see Japanese Journal of Applied Physics 34 (1994) pL587)

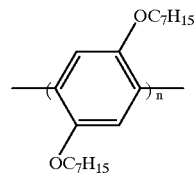

poly(3-cyclohexyl-4-methyl-thiophene)

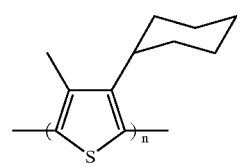

a material such as poly(1,8-octanedioxy-2,6-dimethoxy-1,4-phenylene1, 2-ethenylene-1,4-phenylene-1,2ethenylene-3, 5-dimethoxy-1,4-phenylene) (see Journal of Applied Physics 75 (1993) p3584)

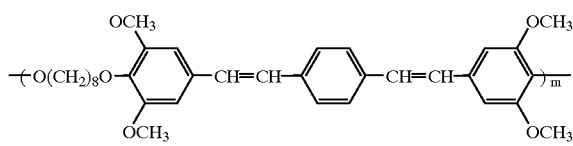

DPVBi, a distyrylarylene derivative, (see Appl. Phys. Lett. 67 (1995) p3853)

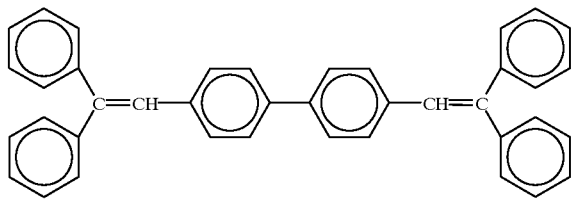

and a spiro-linked oligo-phenyl (se Ber. Bunsenges. Phys. Chem. 100 (1996) p1667) such as

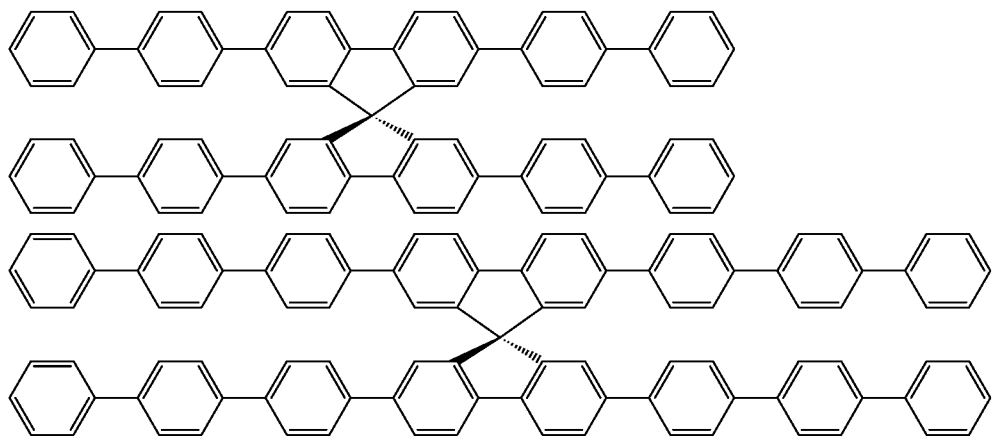

oligomers or polymers. The second and/or third organic material is preferably partially or fully conjugated. It is preferably a polymer and most preferably a conjugated polymer.

Materials suitable for the third organic material include polyphenylene derivatives, polyfluorene derivatives, a material such as poly(1,8-octanedioxy-2,6-dimethoxy-1, 4-phenylene-1,2-ethenylene-1,4-phenylene-1,2-ethenylene-3,5-dimethoxy-1, 4-phenylene), a material such as poly(2, 5-diheptyl-1,4-phenylene-alt-2,5-thienylene), thiophene derivatives and PPV-type polymers, especially PPV-type polymers with broken conjugation (e.g. a segmented or meta-linked system).

Materials suitable for the second organic material include soluble di-alkoxy derivatives of PPV.

Preferably most or substantially all of the light emitted from the second light-emissive region is emitted from the first component. Preferably the third organic material is emissive at relatively short visible wavelengths, for example blue. Preferably the second organic material is emissive at relatively long visible wavelengths, for example red. Preferably the first organic material is emissive at an intermediate visible wavelength, for example green. Alternatively the first organic material could be non-light-emissive.

The second component may also comprise a light-emissive material. The second component preferably has a wider band gap than the first component. The second component preferably comprises a charge transporting and/or charge localising material.

At least part of one or both of the first and second light-emissive regions preferably lies within 500Å of one of the charge-carrier injecting layers, preferably the said other of the charge-carrier injecting layers.

The device may also comprise a third light-emissive region, comprising a fourth organic material, located between the layer of a first organic material and the said one of the charge-carrier injecting layers. The fourth organic material preferably has an energy gap between those of the second organic material and the third organic material. The third light-emissive region may be integral with the layer of a first organic material, in which case the first organic material and the fourth organic material are preferably the same.

The device may also comprise a further organic layer, suitably located between the first charge-carrier injecting layer and one or both of the first and second light-emissive regions. The further organic layer may comprise a conductive polymer, for example polyaniline, polypyrrole, a derivative of polythiophene or (most preferably) polystyrene sulphonic acid doped polyethylene dioxythiophene ("PEDT-PSS"). The further organic layer could comprise a molecular or polymeric charge transport material.

The first emissive region and/or the second emissive region and/or the third emissive region are preferably layers. The first region, the second region and the third region are preferably in the same plane in the device structure. The first region and/or the second region and/or the third region preferably abut the layer of a first organic material, suitably across the whole of one of their major surfaces. The first region and the second region are preferably spaced apart by a zone of the first organic material and/or by the third region. The first, second and third regions preferably do not overlap in the device structure. The first region and/or the second region and/or the third region are preferably patterned, by any suitable method (e.g. photolithography or inkjet printing). One or both of the charge-injecting layers is preferably patterned to allow the first, second and third regions to be individually addressed for charge-carrier injection.

The device is preferably a multi-colour display device, preferably a three-colour display device and most preferably a red, green and blue emissive display device.

BRIEF DESCRIPTION OF THE DRAWINGS

The present invention will now be described by way of example with reference to the accompanying drawings, in which.

DETAILED DESCRIPTION OF THE PREFERRED EMBODIMENT

Figure 1:
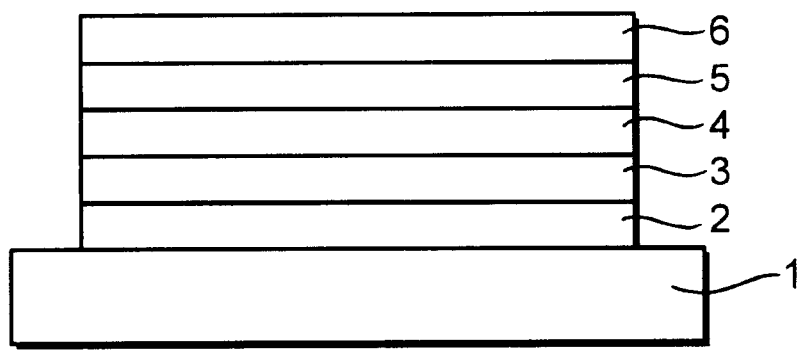
FIG. 1 shows a cross-section of an electroluminescent device.

FIG. 1 shows an electroluminescent device having a glass sheet 1 which carries an anode layer 2 for injecting positive charge-carriers, an organic layer 3, an organic layer 4, an organic layer 5 and a cathode 6. The organic layer 3 is formed of PEDT-PSS. The organic layer 4 is a blend of PVK blended with a polyfluorene as a blue light-emissive material. The organic layer 5 is a layer of PPV (green). The anode is formed of ITO and the cathode of an alloy of aluminium and lithium.

To manufacture the device the layers 1 and 2 are provided in the form of a commercially available ITO coated glass substrate, with an ITO resistivity of 15 Ohm/square.

After suitable cleaning the ITO is then coated with the layer 3 of PEDT-PSS. The PEDT-PSS mixture (see EP 0 686 662 and Bayer AG's Provisional Product Information Sheet for Trial Product AI 4071) is of "EL" grade supplied by Bayer AG. It is filtered and then deposited by spin coating on to the ITO layer at 2000 rpm for 60s, yielding a layer roughly 50 nm thick. The PEDT-PSS layer is then purged in a nitrogen atmosphere for 1 hour, heated for 1 hour at 100° C. in a nitrogen atmosphere and then allowed to cool.

The layer 4 is then deposited. The polyfluorene light-emissive component: poly(7,7-diheptyl fluorene), in tetrachloroethane solvent, is blended with PVK in tetrachloroethane solvent to give a 2% w/v solution with a 20% w/w/ content of the polyfluorene in PVK. This blend is spin-coated over the PEDT-PSS layer at 1000 rpm for 50s, yielding a layer approximately 100 nm thick.

The layer 5 is formed by using a roughly 0.5w/v % solution of a precursor to an acetate PPV copolymer spun at 2000 rpm for 60s to yield a 15±5 nm thickness film. This is purged for 1 hour in a nitrogen atmosphere and then converted for 4 hours at 150° C. in a nitrogen atmosphere. The precursor polymer and the resulting PPV copolymer are described in more detail in PCT/GB97/02038.

Finally the cathode 6 is deposited by DC magnetron sputtering from an Al:Li sputter target. During the sputtering process the layer 5 protects the sensitive layer 4 from damage.

The device is then encapsulated for environmental protection.

The device can be tested by applying a voltage of 12 to 15V between the anode and the cathode. The energy levels of the two components of the organic layer 3 are off-set and the energy-gap of the green PPV is less than that of the blue emitter. Therefore, it would normally be expected that emission of light would principally be from the lower band-gap PPV. However, when the voltage is applied across the device, light (of a blue-white colour) is emitted principally from the blue emitter. There is virtually no light emission from the lower band-gap material. The through-current at an applied voltage of 12 to 15V is approximately 10 to 15 mA/cm$^2$.

Two possible explanations for this have been proposed. First, it has been found that photoluminescence and electroluminescence can be quenched significantly in the vicinity of metallic conductors, especially within distances of less than 200 to 500Å. Since the PPV layer is within this distance from the metallic cathode this effect may prevent it from emitting (see H Becker et al. Phys. Ref. B. 56 (1997) p1893). Another potential explanation is that trap states in the PVK inhibit the leaking of excitons to the PPV. Because the excited states are retained in the PVK-containing layer the emission from the PPV is low.

Some alternative embodiments of the device will now be described.

In one alternative embodiment generally the same process steps are followed but, instead of the polyfluorene as the light-emissive material in the layer 4, methoxy substituted distyryl benzene with $C_8$ flexible spacer (poly(1,8-octanedioxy-2, 6-dimethoxy-1,4-phenylene-1,2-ethenylene-1,4-phenylene-1,2-ethenylene-3, 5-dimethoxy-1,4-phenylene)) is used.

In suitable circumstances the PEDT-PSS layer could be omitted, provided the resulting device had the required stability and current/voltage performance.

The cathode could be made of other metals or alloys, especially ones having a low work function, for example, calcium.

Figure 2:
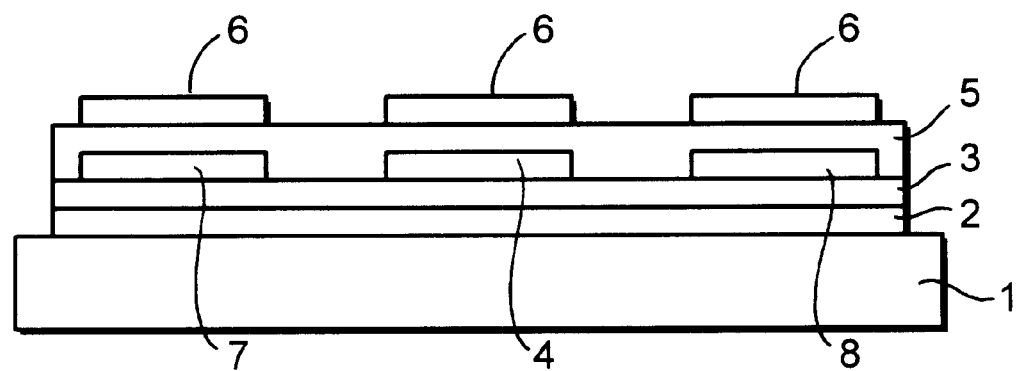
FIG. 2 shows a cross-section of a multi-colour electroluminescent device.

FIG. 2 shows an embodiment suitable for use as part of a multi-colour display device, in which like components are numbered as for FIG. 1. This embodiment uses the principle described above to provide an improved and simplified structure for a multi-colour device. In the embodiment of FIG. 2 there are additional red 7 and green 8 emissive regions and the cathode 6 is patterned to allow the emissive regions 4, 7 and 8 to be individually addressed. In practice it is often necessary to pattern the anode too. The device is manufactured as for the one described above, but with the additional red region 7 (which could be of a soluble di-alkoxy PPV derivative) and the green region 8 (which could be of the same material as the layer 5). When the red region 7 is addressed the emitted light is red: the red region can emit from lower energy states than the overlying green region. When the blue region 4 is addressed the emitted light is blue, according to the principle described above. When the green region is addressed the emitted light is green: it does not matter whether this is emitted from layer 8 or the layer 5, indeed the layers 8 and 5 could be merged and not distinct. Obviously, additional colours and/or colours other than red, green and blue could be provided.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

What is claimed is:

1. An electroluminescent device comprising:
    a first charge-carrier injecting layer for injecting positive charge-carriers;
    a second charge-carrier injecting layer for injecting negative charge-carriers;
    a layer of a first organic material located between the charge-carrier injecting layers; and located between the layer of the first organic material and one of the charge-carrier injecting layers;
    a first light-emissive region comprising a light-emissive second organic material having an energy-gap less than that of the first organic material; and a second light-emissive region comprising a mixture or a blend of a first component of a light-emissive third organic material having an energy-gap greater than that of the first organic material, and a second component having at least one energy level off-set from that of the first component;

such that when charge-carriers are injected in the first light-emissive region by the charge-carrier injecting layers light is emitted principally from the second organic material and when charge-carriers are injected in the second light-emissive region by the charge-carrier injecting layers light is emitted principally from the third organic material.

2. An electroluminescent device as claimed in claim 1, wherein the, first organic material is an at least partially conjugated material.

3. An electroluminescent device as claimed in claim 1, wherein the first organic material is a polymer.

4. An electroluminescent device as claimed in claim 1, wherein the first organic material is a light-emissive material.

5. An electroluminescent device as claimed in claim 1, wherein the first organic material comprises poly(p-phenylenevinylene).

6. An electroluminescent device as claimed in claim 1, wherein the layer of a first organic material is resistant to degradation during a sputter deposition process.

7. An electroluminescent device as claimed in claim 1, wherein the said one of the charge-injecting layers is the first charge-injecting layer.

8. An electroluminescent device as claimed in claim 1, wherein the layer of the first organic material abuts the second charge-carrier injecting layer.

9. An electroluminescent device as claimed in claim 8, wherein the second charge-carrier injecting layer is a sputter-deposited layer.

10. An electroluminescent device as claimed in claim 1, wherein the third organic material is an at least partially conjugated material.

11. An electroluminescent device as claimed in claim 1, wherein the third organic material is a polymer.

12. An electroluminescent device as claimed in claim 1, wherein the second component comprises a charge transporting and charge localizing material.

13. An electroluminescent device as claimed in claim 1, wherein the first organic material is a green-light-emissive material.

14. An electroluminescent device as claimed in claim 1, wherein the second organic material is a red-light-emissive material.

15. An electroluminescent device as claimed in claim 1, wherein the third organic, material is a blue-light-emissive material.

16. An electroluminescent device as claimed in claim 1, wherein the second component comprises a light-emissive material.

17. An electroluminescent device as claimed in claim 1, wherein light emission from the first organic material is essentially suppressed.

18. An electroluminescent device as claimed in claim 1, wherein the first light-emissive region abuts the layer of the first organic material.

19. An electroluminescent device as claimed in claim 1, wherein the second light-emissive region abuts the layer of the first organic material.

20. An electroluminescent device as claimed in claim 1, wherein the second charge-carrier injecting layer is a metal or alloy having a work function less than 3.5 eV.

21. An electroluminescent device as claimed in claim 1, wherein the thickness of the layer of the first organic material is less than 500 angstroms.

22. An electroluminescent device as claimed in claim 1, wherein the second light-emissive region is located within 500 angstroms from said one of the charge-injecting layers.

23. An electroluminescent device as claimed in claim 1, wherein the layer of the first organic material is located between the second charge-carrier injecting layer and the first and second light-emissive regions, and wherein a further layer comprising a conductive polymer is located between the first charge-carrier injecting layer and the first and second light emissive region.

24. An electroluminescent device as claimed in claim 1, wherein the second component comprises a charge transporting material.

25. An electroluminescent device as claimed in claim 1, wherein the second component comprises a charge localizing material.

26. An electroluminescent device as claimed in claim 1, wherein the first and second light-emissive regions are co-planar.

* * * * *

UNITED STATES PATENT AND TRADEMARK OFFICE
CERTIFICATE OF CORRECTION

PATENT NO. : 6,384,528 B1
DATED : May 7, 2002
INVENTOR(S) : Friend et al.

It is certified that error appears in the above-identified patent and that said Letters Patent is hereby corrected as shown below:

Column 8,
Line 64, delete "layers;" and substitute -- layers: --.

Column 8, lines 56-67 and Column 9, lines 1-13,
Claim 1, should read as follows:

1. An electroluminescent device comprising:
    a first charge-carrier injecting layer for injecting positive charge-carriers;

a second charge-carrier injecting layer for injecting negative charge-carriers;

a layer of a first organic material located between the charge-carrier injecting layers; and located between the layer of the first organic material and one of the charge-carrier injecting layers:

a first light-emissive region comprising a light-emissive second organic material having an energy-gap less than that of the first organic material; and a second light-emissive region comprising a mixture or a blend of a first component of a light-emissive third organic material having an energy-gap greater than that of the first organic material, and a second component having at least one energy level off-set from that of the first component;

such that when charge-carriers are injected in the first light-emissive region by the charge-carrier injecting layers light is emitted principally from the second organic material and when charge-carriers are injected in the second light-emissive region by the charge-carrier injecting layers light is emitted principally from the third organic material.

UNITED STATES PATENT AND TRADEMARK OFFICE
CERTIFICATE OF CORRECTION

PATENT NO. : 6,384,528 B1
DATED : May 7, 2002
INVENTOR(S) : Friend et al.

It is certified that error appears in the above-identified patent and that said Letters Patent is hereby corrected as shown below:

Column 9,
Line 15, after "wherein the" delete the comma

Column 10,
Line 5, after "organic" delete the comma

Signed and Sealed this

Ninth Day of July, 2002

*Attest:*

*Attesting Officer*

JAMES E. ROGAN
*Director of the United States Patent and Trademark Office*